United States Patent
Gordon et al.

(10) Patent No.: US 7,271,950 B1
(45) Date of Patent: Sep. 18, 2007

(54) APPARATUS AND METHOD FOR OPTIMIZING A PELLICLE FOR OFF-AXIS TRANSMISSION OF LIGHT

(75) Inventors: Joseph S Gordon, Gardiner, NY (US); Gregory P Hughes, Austin, TX (US); Franklin D Kalk, Austin, TX (US); Hakki U Alpay, Poughquag, NY (US)

(73) Assignee: Toppan Photomasks, Inc., Round Rock, TX (US)

( * ) Notice: Subject to any disclaimer, the term of this patent is extended or adjusted under 35 U.S.C. 154(b) by 0 days.

(21) Appl. No.: 09/784,800

(22) Filed: Feb. 15, 2001

Related U.S. Application Data

(60) Provisional application No. 60/182,824, filed on Feb. 16, 2000.

(51) Int. Cl.
G02B 5/28 (2006.01)
G03F 1/00 (2006.01)

(52) U.S. Cl. .............. 359/359; 359/350; 430/5

(58) Field of Classification Search ........... 359/350, 359/361, 368, 359, 586, 578, 577, 589, 237, 359/239, 587; 428/215, 212, 194; 356/237, 356/239, 351, 239.7; 156/344; 256/239; 430/5

See application file for complete search history.

(56) References Cited

U.S. PATENT DOCUMENTS

| | | | | |
|---|---|---|---|---|
| 4,657,805 A | * | 4/1987 | Fukumitsu et al. | 428/215 |
| 4,966,457 A | * | 10/1990 | Hayano et al. | 356/239.7 |
| 5,061,024 A | | 10/1991 | Keys | 359/350 |
| 5,073,018 A | * | 12/1991 | Kino et al. | 359/368 |
| 5,339,197 A | | 8/1994 | Yen | 359/359 |
| 5,368,675 A | * | 11/1994 | Hamada et al. | 156/544 |
| 5,741,576 A | | 4/1998 | Kuo | 428/212 |
| 5,742,386 A | * | 4/1998 | Nose et al. | 356/237 |

* cited by examiner

Primary Examiner—Audrey Chang

(74) Attorney, Agent, or Firm—Baker Botts L.L.P.

(57) ABSTRACT

An apparatus and method for optimizing a pellicle for off-axis transmission are disclosed. A pellicle includes a thin film optimized for transmission of off-axis incident light at a desired angle. The pellicle further includes an optical thickness greater than a design thickness by less than or equal to approximately one-quarter of an exposure wavelength.

21 Claims, 3 Drawing Sheets

APPARATUS AND METHOD FOR OPTIMIZING A PELLICLE FOR OFF-AXIS TRANSMISSION OF LIGHT

CROSS REFERENCE TO RELATED APPLICATION

This application claims priority from U.S. Provisional Patent Application Ser. No. 60/182,824 filed Feb. 16, 2000, and entitled "Pellicle Optimized For Off-Axis Transmission."

TECHNICAL FIELD OF THE INVENTION

This invention relates in general to semiconductor projection lithography and more specifically to an apparatus and method for optimizing a pellicle for off-axis transmission of light.

BACKGROUND OF THE INVENTION

Today, photolithography requires short exposure wavelengths for successful imaging of very small semiconductor device dimensions. Photolithography systems must capture diffracted, off-axis light in order to resolve the fine features of an image since off-axis light contains spatial information needed to reconstruct the fine features, such as geometry line edges. Failure to capture the off-axis light within the system results in degradation of the quality of the image and loss of the ability to accurately reconstruct the fine features of the geometry being imaged.

FIG. 1 illustrates a graph of the diffraction angle of light passing through a slit, such as a transparent opening in a photomask, versus the relative intensity. When incident light encounters the slit, an illumination intensity profile, known as a Fraunhofer diffraction pattern, results that is a function of the slit width and the wavelength of the incident light. The central peak of the Fraunhofer pattern is typically known as the zero order peak and the order of each peak from the center increases by one, e.g., the first peak on either side of the central peak is a first order peak.

In a photolithography system, an imaging lens should capture the zero order peak and at least one higher order peak to create an accurate image on a wafer since the zero order peak contains the intensity of the image and the higher order peaks contain the image's spatial information. Reduced geometry sizes, however, require smaller transparent opening widths in the photomask. As the opening widths decrease, the angle of diffraction for the higher order peaks increases, which creates a need for an imaging lens that has a larger numerical aperture (NA). The relationship between the resolution of a photolithography system, e.g., the minimum feature size of an image, and the numerical aperture of the imaging lens is described by Rayleigh's formula, which may be expressed as:

$$\text{resolution} = k_1 \lambda / NA$$

where $k_1$ represents the prefactor and $\lambda$ is the wavelength of light emitted by a radiant energy source in the photolithography system.

As shown by the expression, resolution of a photolithography system is directly proportional to the wavelength and the prefactor and inversely proportional to the numerical aperture. The value of the prefactor, and thus the resolution of the associated photolithography system, is dependent upon the properties of the photoresist. As resists improve, the minimum feature size that can be satisfactorily imaged becomes smaller. Furthermore, as the wavelength of light is reduced by using a different light source, such as an Argon-Fluoride excimer laser instead of a Mercury arc lamp, the minimum feature size may be reduced even further. Higher resolution through increased numerical aperture requires optics that are physically larger. This, however, leads to practical design and manufacturing problems.

Other methods for increasing the capability of a photolithography system include using off-axis illumination. Referring to FIG. 2A, a schematic diagram of conventional normal incidence illumination system 10 is shown. Incident light 12 strikes mask 14 with an angle of incidence approximately equal to zero degrees with respect to normal. Light 12 passes through single slit 11 of mask 14 and is diffracted into zero order peak 16 and first order peaks 17 and 18. Zero order peak 16 has the greatest intensity and an angle of diffraction approximately equal to zero degrees. First order peaks 17 and 18 have lower intensities and respective angles of diffraction greater than zero degrees. Lens 20 may capture zero order peak 16 and project the image features present in zero order peak 16 onto a wafer (not expressly shown). Lens 20 may also project spatial information contained in first order peaks 17 and 18 onto the wafer if the numerical aperture of lens 20 is sufficiently large enough to capture light having angles of diffraction larger than zero degrees.

To satisfactorily image smaller device features, the width of slit 11 in mask 14 must be decreased. The smaller slit width causes the angle of diffraction of first order peaks 17 and 18 to increase. Therefore, capturing first order peaks 17 and 18 for smaller device features may require an imaging lens with a large numerical aperture. Large numerical aperture lens systems are currently being developed but are generally more costly to implement. As previously noted, physically larger lenses may lead to practical design and manufacturing problems.

Referring now to FIG. 2B, a schematic diagram of conventional off-axis illumination system 30 is shown. Incident light 32 strikes mask 34 with an angle of incidence greater than zero degrees with respect to normal. Incident light 32 passes through single slit 31 and is diffracted. Zero order peak 36 preferably has an angle of diffraction approximately equal to the angle of incidence. First order peaks 37 and 38 are diffracted at respective angles equidistant from zero order peak 36. Since incident light 32 has an angle of incidence greater than zero, first order peak 37 has an angle of diffraction less than zero order peak 36 while first order peak 38 has an angle of diffraction greater than zero order peak 36. The angle of incidence for illumination is chosen such that lens 40 may capture zero order peak 36 and first order peak 37, and project the image features present in zero order peak 36 and first order peak 37 onto a wafer (not expressly shown). Off-axis illumination system 30 may capture more spatial information than normal incidence illumination system 10. However, presently available off-axis illumination systems, such as off-axis illumination system 30, typically do not accurately reproduce all fine features of an image because first order peak 38 has a high angle of diffraction, which cannot be captured by lens 40 without using a much larger numerical aperture lens system.

In most conventional photolithography systems, a pellicle covers the photomask to protect the photomask from contamination. Conventional pellicles are typically designed to transmit on-axis light and attenuate off-axis light. On-axis transmission of light through a conventional pellicle may be maximized for one or more exposure wavelengths by manufacturing the pellicle to have an actual or physical thickness that is approximately equal to a design thickness that produces transmission maxima at the exposure wavelengths. As a result, conventional pellicles reduce the resolution of the associated photolithography systems.

Anti-reflective coatings applied on conventional pellicles have also been used to improve the on-axis and off-axis performance of the pellicle. The coating is typically tuned to reduce reflection from both surfaces of the pellicle and typically decreases the distance between the peaks and valleys of transmission versus wavelength. A conventional pellicle, however, is generally tuned to optimize the transmission of on-axis light, which results in the reduced transmission of off-axis light.

SUMMARY OF THE INVENTION

In accordance with the teachings of the present invention, the disadvantages and problems associated with optimizing a pellicle for off-axis transmission of light have been substantially reduced or eliminated. In a particular embodiment, an apparatus for optimizing a pellicle for off-axis transmission of light is disclosed that has an optical thickness designed to transmit off-axis incident light at a wavelength slightly greater than an exposure wavelength.

In accordance with one embodiment of the present invention, a pellicle includes a thin film optimized for maximum transmission of off-axis incident light at a desired angle.

In accordance with another embodiment of the present invention, a pellicle includes a thin film having an optical thickness greater than a design thickness that produces a transmission maxima for normal incidence light at a desired exposure wavelength. The optical thickness preferably is optimized for transmission of off-axis incident light at a desired angle.

In accordance with a further embodiment of the present invention, a system for optimizing off-axis transmission includes a photomask and a pellicle. The pellicle includes a frame coupled to the photomask and a thin film that transmits approximately ninety-nine percent of off-axis light at an exposure wavelength. The thin film has an optical thickness greater than a design thickness that produces a transmission maxima for normal incidence light at the exposure wavelength.

In accordance with an additional embodiment of the present invention, a method for performing photolithography includes forming a thin film with an optical thickness greater than a design thickness that produces a transmission maxima for normal incidence light at an exposure wavelength. The optical thickness is optimized for transmission of off-axis incident light through the thin film. The method further includes attaching the thin film to a frame to form a pellicle, mounting the pellicle to a photomask, and exposing the pellicle and the photomask to radiant energy having the exposure wavelength.

Important technical advantages of certain embodiments of the present invention include increasing the ability of a photolithography system to resolve fine features of an image. Conventional pellicles typically are optimized to transmit normal incidence light at a desired exposure wavelength for a photolithography system. Conventional pellicles may also be optimized to attenuate light diffracted by the transparent openings of a photomask and may prevent the imaging lens from capturing spatial information contained in the diffracted light. A pellicle may be formed in accordance with the teachings of the present invention to optimize off-axis transmission, and therefore, increase the amount of spatial information or fine features of reduced geometry sizes captured by the associated photolithography system.

Another important technical advantage of certain embodiments of the present invention includes a pellicle coated with an anti-reflective material that creates a higher differential between on-axis and off-axis light. By increasing the amount of off-axis light transmitted through the pellicle, the intensity of the high order components containing spatial information for an image may also be increased relative to the low order components containing no spatial information. The increased intensity of the high order components allows for better control of the line edges of fine device features and therefore, increases the resolution of an associated photolithography system. In addition, the disclosed pellicle has improved transmission for light having a broad range of angles of incidence.

Other technical advantages will be readily apparent to one skilled in the art from the following figures, descriptions, and claims.

BRIEF DESCRIPTION OF THE DRAWINGS

For a more complete understanding of the present invention and its advantages, reference is now made to the following description taken in conjunction with the accompanying drawings, in which.

DETAILED DESCRIPTION OF THE INVENTION

Preferred embodiments of the present invention and their advantages are best understood by reference to FIGS. 1 through 7, where like numbers are used to indicate like and corresponding parts.

A photomask is a crucial component of a photolithography printing system because it serves as the template that images a complex geometry, such as an integrated circuit, on a wafer. A pellicle typically covers the photomask in order to protect the photomask from contamination, such as dust particles. The pellicle is typically made of a thin film that is stretched across a metal or plastic frame and is held horizontally parallel to the photomask at some distance away from the photomask surface. The pellicle may be placed between the light source and the photomask, or between the photomask and the imaging lens, or both. The optical characteristics of the pellicle can significantly affect the performance of the photolithography system, including the amount of off-axis light transmitted through the photomask. In a particular embodiment, the pellicle of the present invention increases the transmission of off-axis light through an associated photomask by having an optical thickness that is greater than a design thickness for an exposure wavelength.

Figure 1:
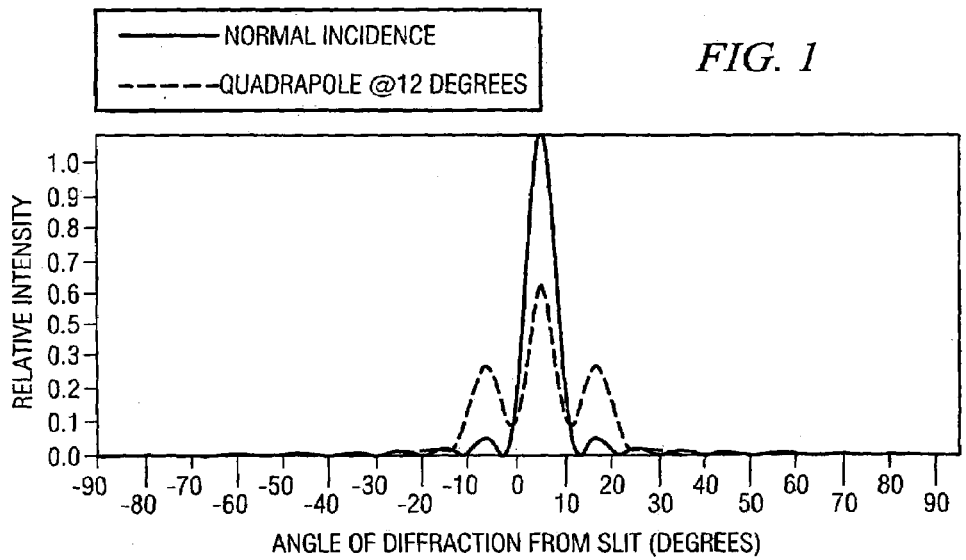
FIG. 1 is a graph illustrating the angle of diffraction from a slit versus relative intensity.
Figure 2A:
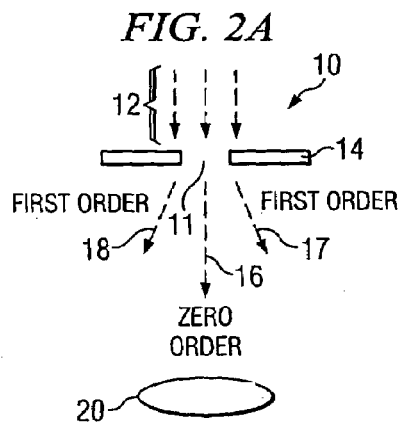
FIG. 2A is a schematic representation of a conventional normal incidence illumination photolithography system.
Figure 2B:
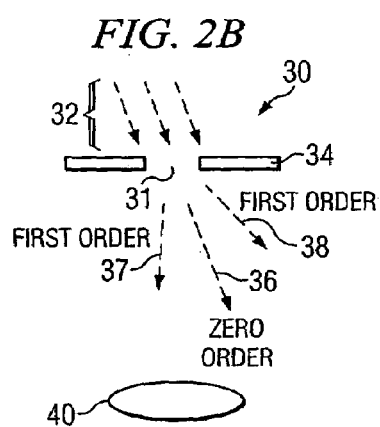
FIG. 2B is a schematic representation of a typical off-axis illumination photolithography system.
Figure 3:
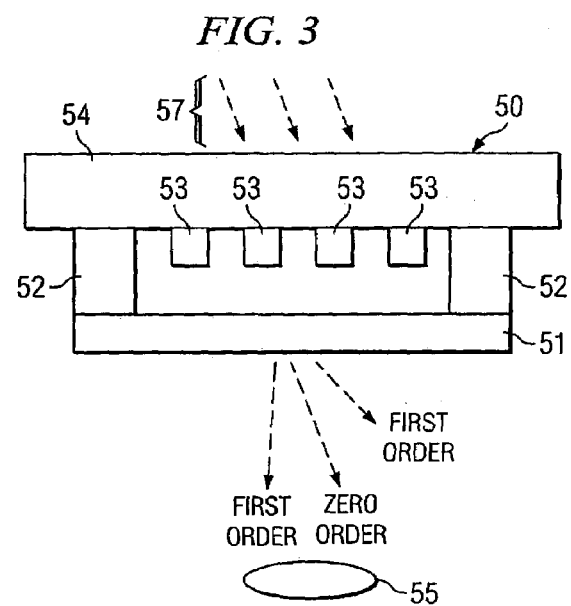
FIG. 3 is a cross-sectional view of a pellicle mounted on a photomask, which may be formed in accordance with the teachings of the present invention.

FIG. 3 illustrates a cross-sectional view of pellicle 50 mounted on photomask 54. Pellicle 50 includes frame 52 and film (or membrane) 51 attached to frame 52. Film 51 may be formed of a material such as nitrocellulose, cellulose acetate, an amorphous fluoropolymer, such as Teflon® AF manufactured by E. I. du Pont de Nemours and Company, or another suitable deep UV film. In one embodiment, film 51 may be prepared by dissolving an amorphous fluoropolymer in a solvent, filtering the solution, and spin coating the solution onto a glass substrate. Preferably, the solution will wet the substrate, form a uniform coating on the substrate, and dry uniformly. Once the solution is coated onto the spinning substrate, spinning is stopped and the coating is heated to evaporate solvent, which forms a uniform film. Film 51 may be transferred from the substrate onto frame 52.

Film 51 may be tautly adhered to frame 52 with conventional glues and adhesives, provided that the glue or adhesive does not contain a solvent for film 51. Alternatively, a non-degrading fluoropolymer, a silicon or poly phophozene based non-adhesive, or a gel like material may be used to adhere film 51 to frame 52 in order to reduce the amount of force used to mount film 51 on frame 52. Frame 52 may be any material that has a high strength, low tendency to attract dust, and is light weight. Hard plastics, and metals such as aluminum or an aluminum alloy may be suitable materials for frame 52.

Film 51 encloses patterned layer 53 on photomask 54 within frame 52. Patterned layer 53 may be formed from a variety of materials, e.g., chrome (Cr) or chromium oxynitrite (CrON), and forms an image of patterned layer 53 that may be projected onto a wafer (not expressly shown). Photomask 54 may have a variety of sizes and shapes, including but not limited to round, rectangular, or square. Photomask 54 may also be any variety of photomask types, including, but not limited to, a one time master, a five inch reticle, a six inch reticle, or a seven inch reticle.

Pellicle 50 protects photomask 54 from dust particles and other contaminates by ensuring that the dust particles and contaminates remain a defined distance away from photomask 54. Any dust particles and contaminates collected on the surface of film 51 will likely be out of focus at the wafer surface and should produce a clear exposed image.

Film 51 may be designed to transmit a large percentage of radiant energy emitted by a radiant energy source associated with the photolithography system. During photolithography, photomask 54 and pellicle 50 are exposed to radiant energy produced by the radiant energy source. The radiant energy may include light of various wavelengths, such as deep ultra violet (UV) light emitted by an Argon-Fluoride excimer laser or wavelengths approximately between the I-line and G-line of a Mercury arc lamp. Pellicle 50 formed in accordance with the teachings of the present invention may be satisfactorily used with all types of electromagnetic energy and is not limited to lightwaves as described in this application.

Figure 4:
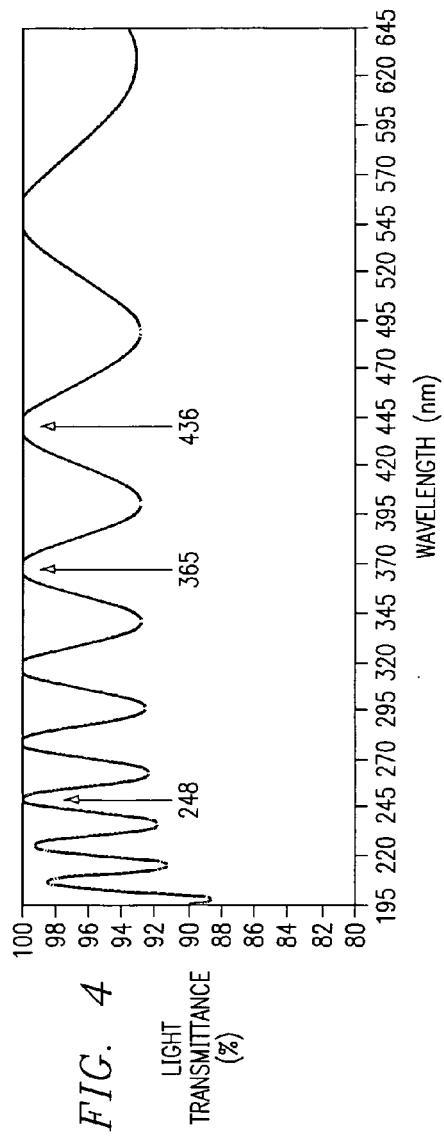
FIG. 4 is a graph illustrating pellicle transmission maxima for various exposure wavelengths for one embodiment of a pellicle formed in accordance with the teachings of the present invention.

FIG. 4 illustrates a graph of one embodiment of pellicle transmission maxima for various exposure wavelengths. Conventional pellicles are designed to have transmission maxima at the selected exposure wavelengths of an associated photolithography system. As shown in FIG. 4, the transmission peaks for the pellicle tested occur at exposure wavelengths of 248 nanometers (nm) (e.g., deep UV), 365 nm (e.g., I-line), and 436 nm (e.g., G-line). The placement of the transmission peaks versus exposure wavelength is directly related to the physical thickness of film 51. In conventional pellicles, the optical thickness of the thin film is designed to be an even multiple of the exposure wavelengths used in the photolithography system in order to produce a peak in transmission at or near one or more of the exposure wavelengths.

Figure 5:
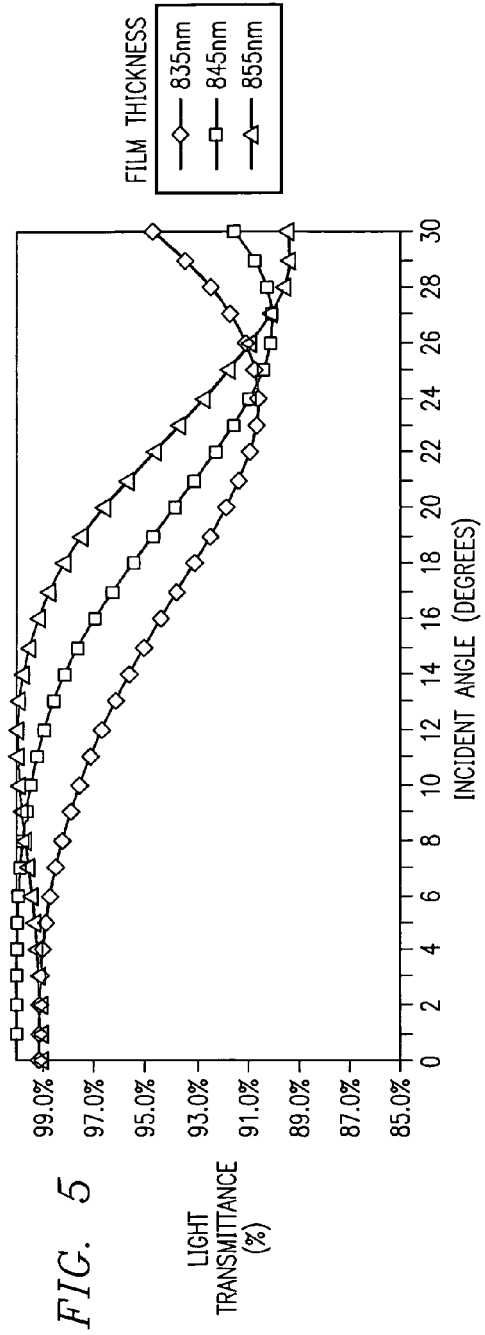
FIG. 5 is a graph illustrating angle of incidence versus transmission of incident light for the pellicle.

FIG. 5 illustrates a graph of transmission of incident light versus angle of incidence for pellicle 50. Conventional pellicles are typically tuned to optimize transmission of on-axis light and therefore, transmission decreases substantially for light diffracted off-axis. As shown by the graph, if film 51 has a design thickness of 845 nm, transmission of incident light drops from approximately ninety-nine percent (99%) at a zero degree angle of diffraction from patterned layer 53 of photomask 54 to approximately ninety-four percent (94%) at a twenty degree angle of diffraction. Since transmission at a given wavelength is directly related to the thickness of film 51, a thicker film may increase the amount of off-axis light captured at the given wavelength.

In the embodiment depicted in FIG. 3, pellicle 50 may be located between photomask 54 and imaging lens 55 of a photolithography system. Radiant energy source 57 emits a wavelength of light toward photomask 54. The incident light first passes through the transparent openings formed by patterned layer 53 of photomask 54 and then passes through film 51. The incident light on photomask 54 diffracts beams that create a Fraunhofer diffraction pattern. Each peak of the Fraunhofer pattern corresponds to the openings' Fourier expansion series terms. If light having large diffraction angles is collected by the imaging lens 55, the projected image will consist of an increased amount of Fourier expansion series terms. The zero term of the series expansion contains only the intensity of the illumination and not the spatial information of the opening. At least the first-order terms are required for some dimensions of the openings to be reproduced in the image. The greater number of terms that are retained in the expansion, the more likely that the image will resemble the shape of the opening.

In one embodiment, off-axis transmission of light may be increased by designing the optical thickness of film 51 to be less than or equal to one-quarter of the exposure wavelength greater than a design thickness that produces a transmission maxima at the exposure wavelength. The optical thickness of film 51 may be expressed as:

$$\text{optical thickness} = n \times d$$

where n is the refractive index of film 51 and d is the physical thickness of film 51. In operation, the optical thickness of film 51 decreases as the angle of diffraction from patterned layer 53 of photomask 54 at the exposure wavelength increases. The increased optical thickness produces a transmission maxima at a wavelength slightly higher, e.g., approximately one to twenty nanometers, than the exposure wavelength for the photolithography system. Therefore, by increasing the optical thickness, film 51 will be optimized for transmission of light at a desired angle that is greater than normal incidence.

The thickness of conventional pellicles are typically bounded by the strength of the material for thinner films and the ability to produce adequately uniform films for thicker films. The thickness of film 51 for a given angle of diffraction from patterned layer 53 may be expressed as:

$$d = N\lambda/2n \cos\theta$$

where N is an integer value representing an order number for the transmission peaks associated with pellicle 50, λ is the exposure wavelength for a particular photolithography system, n is the refractive index of film 51, and θ is the angle of incidence with respect to film 51. As shown in the expression, pellicle 50 produces a transmission maxima at a larger angle of incidence if film 51 is thicker than the design thickness that produces a transmission maxima at the exposure wavelength.

As the physical thickness increases, a higher differential between normal incidence, on-axis transmission and higher angle, off-axis transmission occurs, which optimizes the transmission of light for multiple angles of incidence. By controlling the physical thickness of the pellicle film, the placement of the transmission peaks with respect to wavelength and angle of incidence may be achieved. Furthermore, if a transmission maxima for larger angles of incidence occurs at the exposure wavelength of the photolithography system, the system may capture the spatial information contained in the higher order peaks and create a high resolution image of the openings on the photomask.

Figure 6:
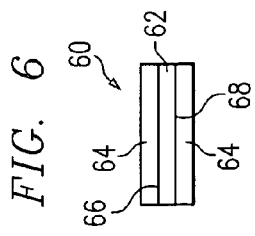
FIG. 6 is a cross-sectional view of a pellicle coated with an anti-reflective material, which may be formed in accordance with the teachings of the present invention.

FIG. 6 illustrates a cross-sectional view of film 60 coated with an anti-reflective material. Film 60 includes substrate 62 coated with an anti-reflective coating 64. Substrate 62 has top surface 66 and bottom surface 68. Substrate 62 may be a thin film formed of a material such as nitrocellulose, cellulose acetate, an amorphous fluoropolymer, or another suitable deep UV film. In the illustrated embodiment, substrate 62 has coating 64 on both top surface 66 and bottom surface 68. In an alternative embodiment, coating 64 may be on either top surface 66 or bottom surface 68. Coating 64 may be a thin film formed of a material such as calcium fluoride ($CaF_2$), magnesium fluoride ($MgF_2$), an amorphous fluoropolymer, or any other suitable material that reduces the amount of light reflected from top surface 66 or bottom surface 68 of substrate 62.

Coating 64 is designed to minimize reflection at a particular angle of incidence by matching the coating 64 to substrate 62. In one embodiment, coating 64 may have a refractive index approximately equal to the square root of the refractive index of substrate 62. In this case, all surface reflection of light will be eliminated for an exposure wavelength at which the product of refractive index times thickness is equal to one-quarter of the exposure wavelength. Furthermore, if coating 64 and substrate 62 are well matched, transmission of off-axis light at the exposure wavelength of the photolithography system should increase.

As described above in reference to the thickness of film 51, as coating 64 thickness increases, the differential between on-axis and off-axis transmission of light also increases. For a single layer coating on top surface 66 and bottom surface 68 of substrate 62, the thickness of coating 64 for a particular angle of incidence may be expressed as:

$$d = N\lambda/4n \cos\theta$$

where N is an odd integer value when the refractive index of coating 64 is less than the refractive index of substrate 62 and an even integer value when the refractive index of coating 64 is greater than the refractive index of substrate 62, λ is the exposure wavelength of a particular photolithography system, n is the refractive index of coating 64, and θ is the angle of incidence. As shown by the expression, a transmission maxima may be produced at a higher angle of incidence when coating 64 has a greater thickness. In one embodiment, coating 64 may have a thickness greater than approximately one-quarter of the exposure wavelength but less than approximately one-half of the exposure wavelength.

Although coating 64 has been described as a single layer, multiple layer anti-reflective coatings may be used by applying the same principles described in reference to the single layer anti-reflective coating. In one embodiment, each of the multiple anti-reflective layers may have a slightly different refractive index. For example, a three coating system may be employed. The first coating may have a refractive index of 1.3, which is relatively close to a typical refractive index for an amorphous fluoropolymer film (e.g., approximately 1.4). The second coating may have a refractive index of 1.2, and the third coating may have a refractive index of 1.1, which is relatively close to the refractive index of air (e.g., approximately 1.0). As such, the difference in refractive index between any two layers would be approximately 0.1 and would produce nearly one-hundred percent (100%) transmission of radiant energy during a photolithographic process. Furthermore, a combination of modifying the thickness of substrate 62 and adding coating 64 to film 60 may be used to improve the amount of off-axis light captured by a given photolithography system.

Figure 7:
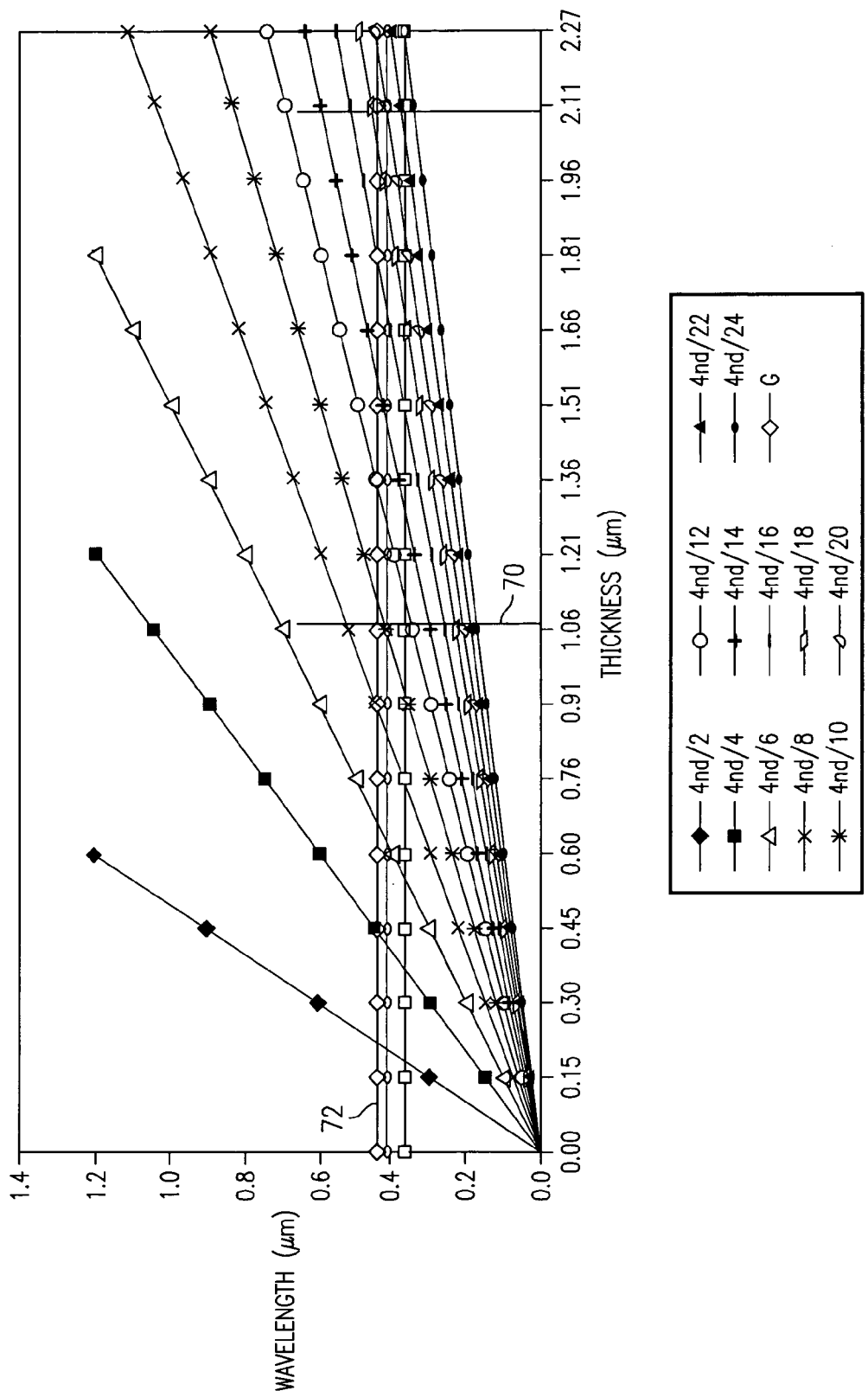
FIG. 7 is a graph illustrating pellicle optical thickness versus transmission maxima.

FIG. 7 illustrates a graph of coating 64 thickness versus transmission maxima. As shown in the legend, each peak in transmission may be assigned an order number and each line on the graph corresponds to one of the order numbers. As the thickness of coating 64 increases, the wavelength at which film 60 has a transmission peak also increases. Vertical line 70 indicates the peak wavelength for an anti-reflective coating having a particular thickness and horizontal line 72 indicates the thickness of the anti-reflective coating that will yield a peak at the chosen wavelength. As shown on the graph, films assigned a lower order number produce peaks at higher wavelengths for a given thickness.

EXAMPLE

A Teflon AF (supplied by E. I. du Pont de Nemours and Company) deep ultra violet pellicle has a refractive index of 1.32, a design thickness of 845 nm, and is tuned to produce a transmission peak at a wavelength of 248 nm. By increasing the physical thickness of the film to 855 nm, the transmission peak occurs at a slightly higher wavelength. As shown in FIG. 5, the thicker pellicle film improves the transmission of off-axis light over the pellicle having a physical thickness approximately equal to the design thickness. Furthermore, a pellicle with a physical thickness of 835 nm reduces the transmission of off-axis light compared to the pellicle with a physical thickness approximately equal to the design thickness.

Although the present invention has been described in detail, it should be understood that various changes, substitutions, and alterations can be made without departing from the spirit and scope of the invention as defined by the appended claims.

What is claimed is:

1. A pellicle operable to transmit light at a particular wavelength, the pellicle comprising:
    a frame; and
    an amorphous fluoropolymer thin film coupled to the frame, the thin film operable to transmit light at a particular wavelength for projecting a photomask image onto a wafer during a photolithographic process, the thin film including an optical thickness greater than a design thickness by an amount less than or equal to approximately one-quarter of the particular wavelength such that transmission of light through the thin film at the particular wavelength at an angle of incidence greater than zero is substantially maximized, the design thickness comprising a thickness of the thin film that maximizes transmission of light incident to the thin film at a normal angle at the particular wavelength;

the thin film formed to cooperate with a photomask including an opening such that when light is transmitted at the particular wavelength through the opening in the photomask, through the thin film and onto the wafer to project an image of the photomask opening onto the wafer, wherein a portion of the transmitted light is diffracted by the photomask opening and passes through the thin film at the angle of incidence greater than zero, the transmission of such portion of light passing through the thin film at the angle of incidence greater than zero being maximized due to the optical thickness of the thin film produces an increased resolution of the projected image on the wafer.

2. The pellicle of claim 1, further comprising the thin film enabling an associated peak in transmittance for normal incidence light at a wavelength of less than approximately twenty nanometers above the particular wavelength.

3. The pellicle of claim 1, further comprising an anti-reflective coating disposed on a top surface and a bottom surface of the thin film.

4. The pellicle of claim 3, wherein the anti-reflective coating includes a first refractive index approximately equal to the square root of a second refractive index associated with the thin film.

5. The pellicle of claim 3, further comprising the thin film enabling an associated a peak in transmittance for normal incidence light at a wavelength between approximately one nanometer and approximately twenty nanometers above the particular wavelength.

6. The pellicle of claim 3, wherein the anti-reflective coating includes a thickness between approximately one-quarter of the particular wavelength and approximately one-half of the particular wavelength.

7. The pellicle of claim 1, further comprising a plurality of adjoining anti-reflective coatings disposed on a top surface and a bottom surface of the thin film, each of the anti-reflective coatings including a different refractive index.

8. The pellicle of claim 1, wherein:
the thin film includes a thickness of approximately 855 nanometers; and
the particular wavelength is between approximately 248 nanometers and approximately 436 nanometers.

9. A photolithography system for optimizing off-axis transmission of light, comprising:
a photomask including an opening, the photomask operable for use in a photolithographic process in which an image of the opening is transferred to a wafer; and
a pellicle comprising:
a frame coupled to the photomask; and
an amorphous fluoropolymer thin film coupled to the frame, the thin film operable to transmit approximately ninety-nine percent (99%) of off-axis light at a particular wavelength such that during the photolithographic process in which light is transmitted at the particular wavelength through the opening in the photomask, through the thin film and onto the wafer to project an image of the photomask opening onto the wafer, wherein a portion of the transmitted light is diffracted by the photomask opening and passes through the thin film as off-axis light, the approximate 99% transmission of such off-axis light produces an increased resolution of the image of the opening projected onto the wafer.

10. The system of claim 9, further comprising the thin film including an optical thickness greater than a design thickness by less than or equal to approximately one-quarter of the particular wavelength, the design thickness comprising a thickness of the thin film that maximizes transmission of light incident to the thin film at a normal angle at the particular wavelength.

11. The pellicle of claim 9, further comprising the thin film enabling an associated peak in transmittance for normal incidence light at a wavelength of less than approximately twenty nanometers above the particular wavelength.

12. The system of claim 9, further comprising an anti-reflective coating disposed on a top surface and a bottom surface of the thin film, the anti-reflective coating including a thickness between approximately one-quarter of the particular wavelength and approximately one-half of the particular wavelength.

13. The pellicle of claim 12, further comprising the thin film enabling an associated a peak in transmittance for normal incidence light at a wavelength of less than approximately twenty nanometers above the particular wavelength.

14. The system of claim 12, wherein the anti-reflective coating includes a first refractive index approximately equal to the square root of a second refractive index associated with the thin film.

15. The system of claim 9, further comprising a plurality of adjoining anti-reflective coatings disposed on a top surface and a bottom surface of the thin film, each of the anti-reflective coatings including a different refractive index.

16. The system of claim 9, wherein the frame comprises aluminum.

17. A method for performing photolithography, comprising:
forming an amorphous fluoropolymer thin film including an optical thickness, the optical thickness being greater than a design thickness by an amount less than or equal to approximately one-quarter of a particular wavelength such that transmission of light through the thin film at the particular wavelength at an angle of incidence greater than zero is substantially maximized, the design thickness comprising a thickness of the thin film that maximizes transmission of light incident to the thin film at a normal angle at the particular wavelength;
attaching the thin film to a frame to form a pellicle;
mounting the pellicle on a photomask including an opening;
exposing the pellicle and the photomask to radiant energy having the particular wavelength, the radiant energy being incident upon the pellicle at the angle of incidence greater than zero; and
projecting the radiant energy through the opening in the photomask, through the thin film and onto a wafer to form an image of the photomask opening on the wafer, wherein a portion of the projected light is diffracted by the photomask opening and passes through the thin film at the angle of incidence greater than zero for which the transmission of light through the film is substantially maximized, such that the thin film substantially maximizes projection of the diffracted portion of light onto the wafer due to the optical thickness of the thin film in order to increase the resolution of the image of the photomask opening projected on the wafer.

18. The method of claim 17, further comprising coating a top surface of the thin film with an anti-reflective material, the anti-reflective material including a thickness between approximately one-quarter of the particular wavelength and approximately one-half of the particular wavelength.

19. The method of claim 18, further comprising coating a bottom surface of the thin film with the anti-reflective material.

20. The pellicle of claim 17, further comprising the thin film enabling an associated peak in transmittance for normal incidence light at a wavelength of less than approximately twenty nanometers above the particular wavelength.

21. The method of claim 17, further comprising coating at least one of a top surface and a bottom surface of the thin film with a plurality of adjoining layers of anti-reflective material, each layer including a different refractive index.

* * * * *